(12) United States Patent
Chen (10) Patent No.: US 12,354,685 B2
(45) Date of Patent: Jul. 8, 2025

(54) IMPEDANCE ADJUSTING CIRCUIT AND IMPEDANCE ADJUSTING METHOD FOR ZERO QUOTIENT CALIBRATION

(71) Applicant: NANYA TECHNOLOGY CORPORATION, New Taipei (TW)

(72) Inventor: Yu-Wei Chen, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 250 days.

(21) Appl. No.: 18/296,367

(22) Filed: Apr. 5, 2023

(65) Prior Publication Data

US 2024/0339166 A1 Oct. 10, 2024

(51) Int. Cl.
*G11C 29/02* (2006.01)
*G11C 7/10* (2006.01)
*H03K 19/00* (2006.01)

(52) U.S. Cl.
CPC .......... *G11C 29/028* (2013.01); *G11C 7/1066* (2013.01); *H03K 19/0005* (2013.01); *G11C 2207/2254* (2013.01)

(58) Field of Classification Search
CPC ................................................. H03K 19/0005
See application file for complete search history.

(56) References Cited

U.S. PATENT DOCUMENTS

| | | | | |
|---|---|---|---|---|
| 9,531,382 B1* | 12/2016 | Miwa | ................... | H03K 19/003 |
| 2008/0024160 A1* | 1/2008 | Ou-Yang | ............ | H03K 19/0005 |
| | | | | 326/30 |
| 2011/0102073 A1* | 5/2011 | Riho | ................... | H04L 25/0278 |
| | | | | 327/541 |
| 2016/0182044 A1* | 6/2016 | Addepalli | .............. | G11C 16/06 |
| | | | | 326/30 |
| 2016/0254812 A1* | 9/2016 | Miwa | .................. | H03K 19/0005 |
| | | | | 326/30 |
| 2016/0365855 A1* | 12/2016 | Baek | ................... | H03K 19/0005 |
| 2017/0366183 A1* | 12/2017 | Jung | .................... | G11C 11/4085 |

(Continued)

FOREIGN PATENT DOCUMENTS

CN 107527650 12/2017

OTHER PUBLICATIONS

"Office Action of Taiwan Counterpart Application", issued on May 3, 2024, p. 1-p. 9.

(Continued)

*Primary Examiner* — Seokjin Kim
(74) *Attorney, Agent, or Firm* — JCIPRNET (57) ABSTRACT

An impedance adjusting circuit and an impedance adjusting method for zero quotient (ZQ) calibration. The impedance adjusting circuit includes a reference resistor, a first pull-up impedance generator and a second pull-up impedance generator. The reference resistor is coupled between a first sensing node and a low reference voltage. In a first ZQ calibrating operation, the impedance adjusting circuit connects the first pull-up impedance generator to the first sensing node, and compares a first reference voltage and a sensing voltage on the first sensing node to generate the first calibration signal. In a second ZQ calibrating operation, the impedance adjusting circuit connects the second pull-up impedance generator to the first sensing node, and compares a second reference voltage and the sensing voltage to generate the second calibration signal.

20 Claims, 5 Drawing Sheets

(56) References Cited

U.S. PATENT DOCUMENTS

| | | | |
|---|---|---|---|
| 2023/0068894 A1* | 3/2023 | Shin | G11C 7/1057 |
| 2024/0356534 A1* | 10/2024 | Chen | H03H 11/28 |
| 2024/0379138 A1* | 11/2024 | Mathur | G11C 7/1048 |

OTHER PUBLICATIONS

"Office Action of Taiwan Counterpart Application", issued on May 7, 2025, p. 1-p. 8.

* cited by examiner

IMPEDANCE ADJUSTING CIRCUIT AND IMPEDANCE ADJUSTING METHOD FOR ZERO QUOTIENT CALIBRATION

BACKGROUND

Technical Field

The disclosure generally relates to an impedance adjusting circuit and an impedance adjusting method, and more particularly to an impedance adjusting circuit and an impedance adjusting method for zero quotient (ZQ) calibration.

Description of Related Art

Generally, a memory device operates according to an impedance of a drive capability resistor (RON) or a termination resistor (RTT) of an on-die-termination (ODT) element. For example, an input/output terminal (I/O) voltage (VDDQ) of the memory device may be adjusted by the impedance of the RON or the RTT. However, the impedance is varied with variation of voltage and temperature conditions. Thus, the impedance of the RON or the RTT is calibrated using a high-precision reference resistor in a ZQ calibration.

SUMMARY

The disclosure provides an impedance adjusting circuit and an impedance adjusting method for zero quotient (ZQ) calibration.

The impedance adjusting circuit includes a reference resistor 110, a first pull-up impedance generator, a second pull-up impedance generator, a switching circuit and a controller. The reference resistor is coupled between a first sensing node and a low reference voltage. The first pull-up impedance generator is coupled to an external voltage. The first pull-up impedance generator comprises a plurality of first pull-up impedance units for providing a first resistance value respectively in response to a first calibration signal. The second pull-up impedance generator is coupled to the external voltage. The second pull-up impedance generator comprises a plurality of second pull-up impedance units for providing a second resistance value respectively in response to a second calibration signal. The second resistance value is different from the first resistance value. The switching circuit connects the first pull-up impedance generator to the first sensing node in a first ZQ calibrating operation and connects the second pull-up impedance generator to the first sensing node in a second ZQ calibrating operation. The controller is coupled to the first sensing node. The controller compares a first reference voltage and a sensing voltage on the first sensing node to generate the first calibration signal in the first ZQ calibrating operation, and compares a second reference voltage and the sensing voltage on the first sensing node to generate the second calibration signal in the second ZQ calibrating operation.

The impedance adjusting method includes: providing a reference resistor, a first pull-up impedance generator and a second pull-up impedance generator, wherein the reference resistor is coupled between a first sensing node and a low reference voltage, wherein the first pull-up impedance generator comprises a plurality of first pull-up impedance units for providing a first resistance value respectively in response to a first calibration signal, wherein the second pull-up impedance generator comprises a plurality of second pull-up impedance units for providing a second resistance value respectively in response to a second calibration signal, wherein the second resistance value is different from the first resistance value; connecting the first pull-up impedance generator to the first sensing node in a first ZQ calibrating operation; comparing a first reference voltage and a sensing voltage on the first sensing node to generate the first calibration signal in the first ZQ calibrating operation; connecting the second pull-up impedance generator to the first sensing node in a second ZQ calibrating operation; and comparing a second reference voltage and the sensing voltage on the first sensing node to generate the second calibration signal in the second ZQ calibrating operation.

Based on the above, the disclosure provides the second pull-up impedance generator providing the second resistance value. The second resistance value is different from the first resistance value. Therefore, the impedance adjusting circuit increases a parameter adjusting margin of a memory device. Besides, the second pull-up impedance generator is calibrated in the second ZQ calibrating operation. Therefore, a tolerance of the second resistance value is decreased.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Figure 1:
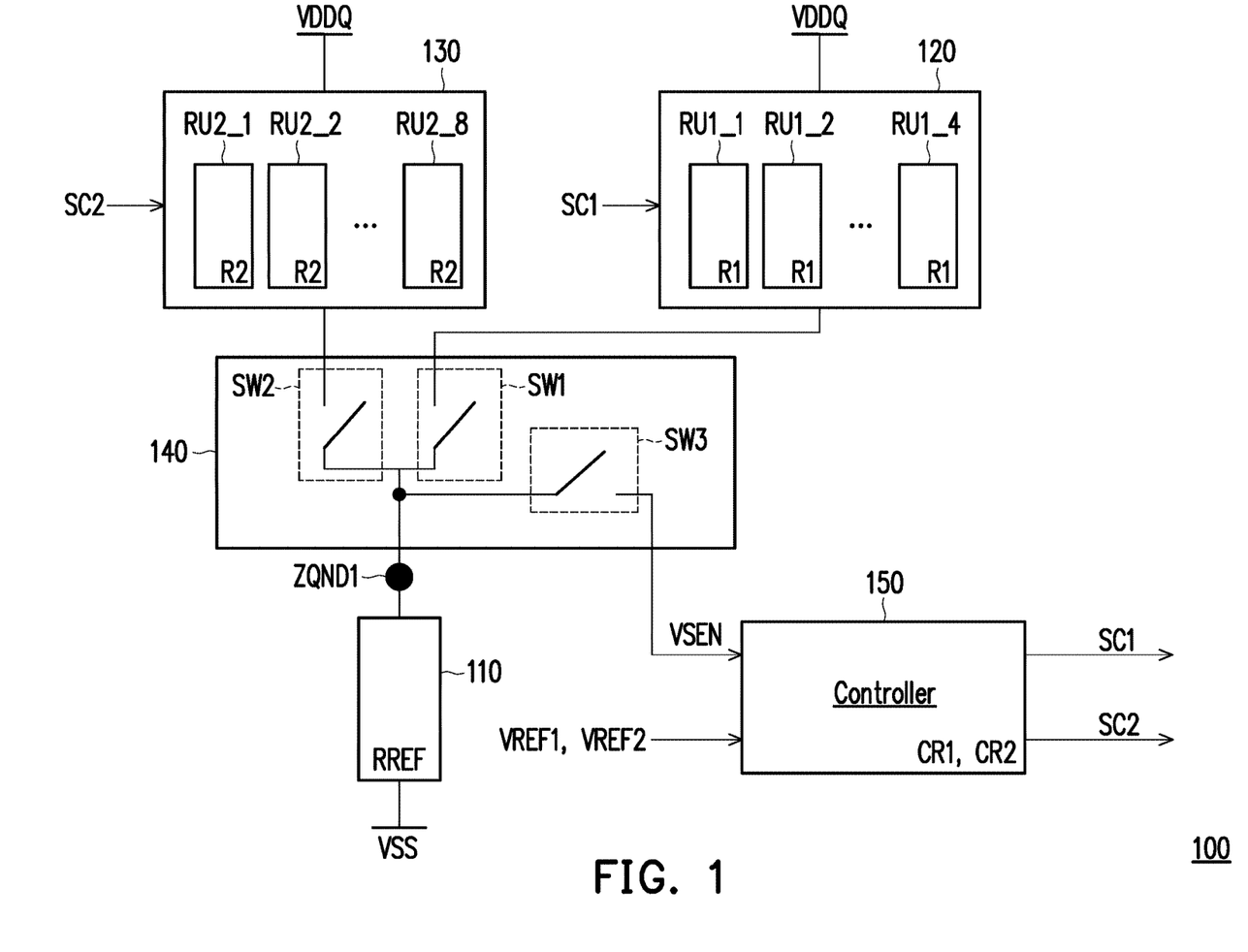
FIG. 1 illustrates a schematic diagram of an impedance adjusting circuit according to an embodiment of the disclosure.

FIG. 1 illustrates a schematic diagram of an impedance adjusting circuit according to an embodiment of the disclosure. Please refer to FIG. 1, in the embodiment, the impedance adjusting circuit 100 includes a reference resistor 110, a first pull-up impedance generator 120, a second pull-up impedance generator 130, a switching circuit 140 and a controller 150. The reference resistor 110 is coupled between a first sensing node ZQND1 and a low reference voltage VSS. For example, the low reference voltage VSS is ground or a reference voltage having 0 volt, but the disclosure is not limited thereto. In the embodiment, the reference resistor 110 is a precision resistor. The reference resistor 110 has a reference resistance value RREF. The reference resistance value RREF is not variated with variation of voltage and temperature conditions. In other words, the reference resistance value RREF is stable. In the embodiment, the first sensing node ZQND1 may be a connecting pad, but the disclosure is not limited thereto.

In the embodiment, the first pull-up impedance generator 120 is coupled to an external voltage VDDQ. The first pull-up impedance generator 120 includes first pull-up impedance units RU1_1 to RU1_4. The first pull-up impedance units RU1_1 to RU1_4 provide a first resistance value R1 respectively in response to a first calibration signal SC1. The second pull-up impedance generator 130 is coupled to the external voltage VDDQ. The second pull-up impedance generator 130 includes second pull-up impedance units RU2_1 to RU2_8. The second pull-up impedance units RU2_1 to RU2_8 provide a second resistance value R2 respectively in response to a second calibration signal SC2. The second resistance value R2 is different from the first resistance value R1.

In the embodiment, the second resistance value R2 is higher than the first resistance value R1. For example, the second resistance value R2 is an integer multiple of the first resistance value R1 and the reference resistance value RREF, but the disclosure is not limited thereto. For example, the reference resistance value RREF is 240 Ohm. The first resistance value R1 is about 240 Ohm. The second resistance value R2 is about 480 Ohm.

In the embodiment, the switching circuit 140 connects the first pull-up impedance generator 120 to the first sensing node ZQND1 in a first ZQ calibrating operation and connects the second pull-up impedance generator 130 to the first sensing node ZQND1 in a second ZQ calibrating operation.

Detailly, in the first ZQ calibrating operation, the switching circuit 140 connects the first pull-up impedance generator 120 to the first sensing node ZQND1 and connects the first sensing node ZQND1 to the controller 150, and disconnects a connection between the first sensing node ZQND1 and the second pull-up impedance generator 130. In the second ZQ calibrating operation, the switching circuit 140 connects the second pull-up impedance generator 130 to the first sensing node ZQND1 and connects the first sensing node ZQND1 to the controller 150, and disconnects a connection between the first sensing node ZQND1 and the first pull-up impedance generator 120.

The controller 150 is coupled to the first sensing node ZQND1 through the switching circuit 140. In the first ZQ calibrating operation, the controller 150 compares a first reference voltage VREF1 and a sensing voltage VSEN on the first sensing node ZQND1 to generate the first calibration signal SC1. The controller 150 provides the first calibration signal SC1 to the first pull-up impedance generator 120. Therefore, the first pull-up impedance generator 120 adjusts the first resistance value R1 in response to the first calibration signal SC1.

In the second ZQ calibrating operation, the controller 150 compares a second reference voltage VREF2 and the sensing voltage VSEN on the first sensing node ZQND1 to generate the second calibration signal SC2. The controller 150 provides the second calibration signal SC2 to the second pull-up impedance generator 130. Therefore, the second pull-up impedance generator 130 adjusts the second resistance value R2 in response to the second calibration signal SC2.

For example, the reference resistance value RREF is 240 Ohm. The first resistance value R1 is about 240 Ohm. The second resistance value R2 is about 480 Ohm. The first pull-up impedance units RU1_1 to RU1_4 are calibrated one by one in the first ZQ calibrating operation. The second pull-up impedance units RU2_1 to RU2_8 are calibrated one by one in the second ZQ calibrating operation. Thus, the first reference voltage VREF1 is set to half of the external voltage VDDQ (that is, VREF1=0.5×VDDQ). The second reference voltage VREF2 is set to one-third of VDDQ (that is, VREF2=0.33×VDDQ). For example, all of the first pull-up impedance units RU1_1 to RU1_4 are connected in parallel in the first ZQ calibrating operation. All of the second pull-up impedance units RU2_1 to RU2_8 are connected in parallel in the second ZQ calibrating operation. Thus, the first reference voltage VREF1 is set to 0.8×VDDQ in the first ZQ calibrating operation. The second reference voltage VREF2 is also set to 0.8×VDDQ in the second ZQ calibrating operation.

It should be noted, the impedance adjusting circuit 100 provides the second pull-up impedance generator 130 providing the second resistance value R2. The second resistance value R2 is different from the first resistance value R1 from the first pull-up impedance generator 120. Therefore, the impedance adjusting circuit 100 increases a parameter adjusting margin of a memory device. For example, after finishing the second ZQ calibrating operation, when one of the second pull-up impedance units RU2_1 to RU2_8 is selected, the impedance adjusting circuit 100 outputs a driving voltage equal to "0.33×VDDQ" through the first sensing node ZQND1. When all of the second pull-up impedance units RU2_1 to RU2_8 are selected, the impedance adjusting circuit 100 outputs a driving voltage equal to "0.8×VDDQ" through the first sensing node ZQND1. Besides, the second pull-up impedance generator 130 is calibrated in the second ZQ calibrating operation. Therefore, a tolerance of the second resistance value R2 is decreased. For example, in the second ZQ calibrating operation, the tolerance of the second resistance value R2 is decreased from 30% to 10%, but the disclosure is not limited thereto.

In the embodiment, the switching circuit 140 includes switches SW1 to SW3. A first terminal of the switch SW1 is connected to the first pull-up impedance generator 120. A second terminal of the switch SW1 is connected to the first sensing node ZQND1. A first terminal of the switch SW2 is connected to the second pull-up impedance generator 130. A second terminal of the switch SW2 is connected to the first sensing node ZQND1. A first terminal of the switch SW3 is connected to the first sensing node ZQND1. A second terminal of the switch SW3 is connected to the controller 150.

In the embodiment, in the first ZQ calibrating operation, the switches SW1 and SW3 are turned on. The switch SW2 is turned off. Therefore, the first pull-up impedance generator 120 and the controller 150 are connected to the first sensing node ZQND1. In the second ZQ calibrating operation, the switches SW2 and SW3 are turned on. The switch SW1 is turned off. Therefore, the second pull-up impedance generator 130 and the controller 150 are connected to the first sensing node ZQND1.

In the embodiment, each of the switches SW1 to SW3 is implemented by at least one transistor or transmission gate. The operations of the switches SW1 to SW3 may be controlled by the controller 150.

In the embodiment, the first pull-up impedance generator 120 includes four first pull-up impedance units RU1_1 to RU1_4. The second pull-up impedance generator 130 includes eight first pull-up impedance units RU2_1 to RU2_8. In some embodiments, the first pull-up impedance generator 120 includes at least one first pull-up impedance unit. The second pull-up impedance generator 130 includes at least one first pull-up impedance unit, the disclosure is not limited by the amount of the first pull-up impedance unit and the amount of the second pull-up impedance unit.

Figure 2:
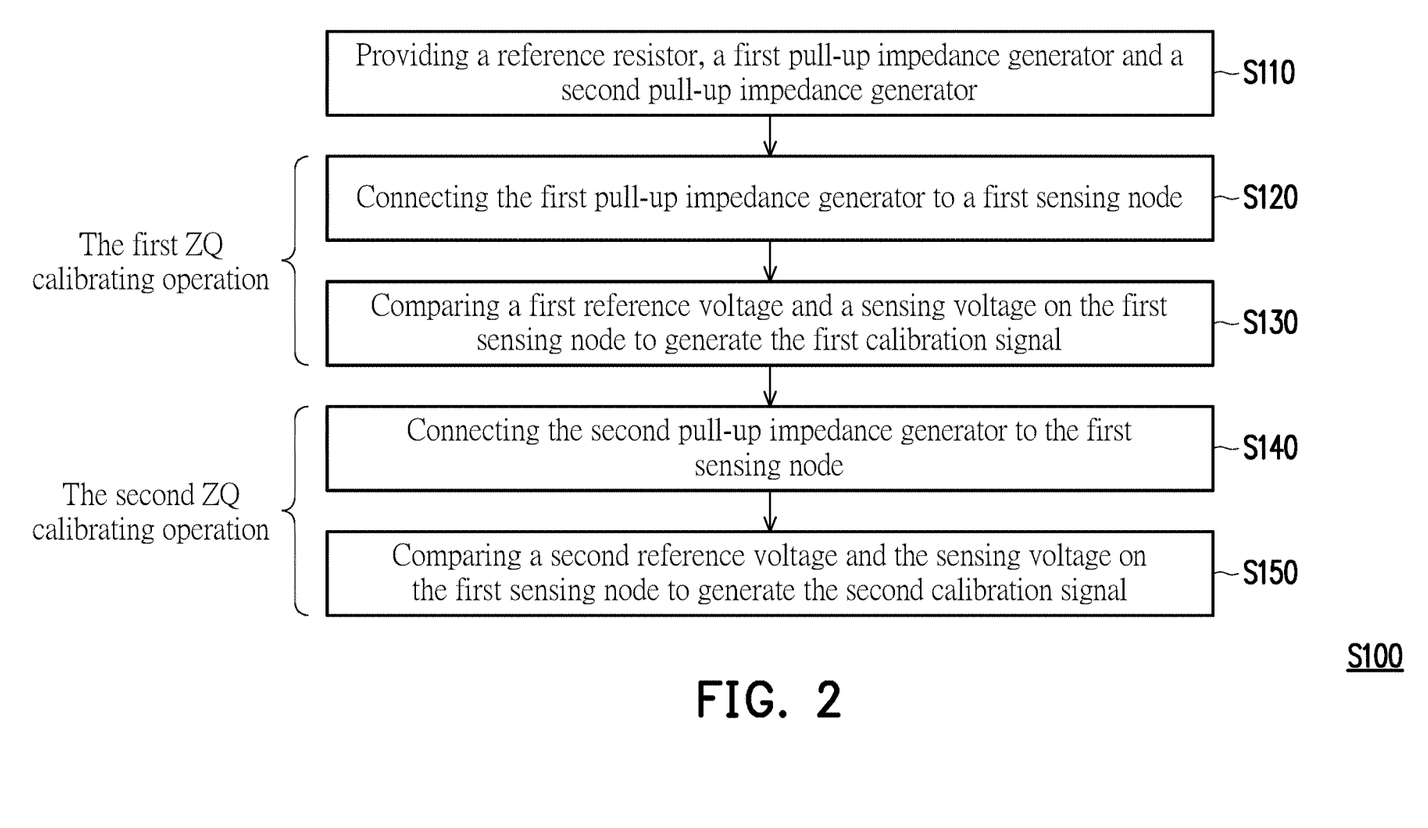
FIG. 2 illustrates a flow chart of an impedance adjusting method according to an embodiment of the disclosure.

FIG. 2 illustrates a flow chart of an impedance adjusting method according to an embodiment of the disclosure. Please refer to FIG. 1 and FIG. 2, in the embodiment, the impedance adjusting method S100 includes steps S110 to S150. In the step S110, the reference resistor 110, the first pull-up impedance generator 120 and the second pull-up impedance generator 130 are provided. The configuration of the reference resistor 110, the first pull-up impedance generator 120 and the second pull-up impedance generator 130 has been clearly explained in the embodiment of FIG. 1, so it will not be repeated here.

In the step S120, in the first ZQ calibrating operation, the first pull-up impedance generator 120 is connected to the first sensing node ZQND1. In the embodiment, the switching circuit 140 connects the first pull-up impedance generator 120 to the first sensing node ZQND1 in the first ZQ calibrating operation. In the step S120, in the first ZQ calibrating operation, the sensing voltage VSEN is generated according to the external voltage VDDQ, the first resistance value R1 and the reference resistance value RREF. In other words, the sensing voltage VSEN is a divided result of the external voltage VDDQ based on the first resistance value R1 and the reference resistance value RREF in the first ZQ calibrating operation.

In the step S130, in the first ZQ calibrating operation, the controller 150 compares the first reference voltage VREF1 and the sensing voltage VSEN to generate the first calibration signal SC1. Therefore, the first pull-up impedance generator 120 adjusts the first resistance value R1 in response to the first calibration signal SC1.

In the step S130, the controller 150 compares a first reference voltage VREF1 and the sensing voltage VSEN to generate a first comparison result CR1 in the first ZQ calibrating operation. In the first ZQ calibrating operation, when the first comparison result CR1 indicates that the sensing voltage VSEN is higher than the first reference voltage VREF1, the controller 150 adjusts a value of the first calibration signal SC1 to a first value. Therefore, the first resistance value R1 is increased by the first value of the first calibration signal SC1. When the first comparison result CR1 indicates that the sensing voltage VSEN is lower than the first reference voltage VREF1, the controller 150 adjusts a value of the first calibration signal SC1 to a second value. Therefore, the first resistance value R1 is decreased by the second value of the first calibration signal SC1. Besides, when the first comparison result CR1 indicates that the sensing voltage VSEN is equal to the first reference voltage VREF1, the first resistance value R1 is equal to the reference resistance value RREF. Thus, the first calibration signal SC1 is not adjusted.

In the step S140, in the second ZQ calibrating operation, the second pull-up impedance generator 130 is connected to the first sensing node ZQND1. In the embodiment, the switching circuit 140 connects the second pull-up impedance generator 130 to the first sensing node ZQND1 in the second ZQ calibrating operation. In the step S140, in the second ZQ calibrating operation, the sensing voltage VSEN is generated according to the external voltage VDDQ, the second resistance value R2 and the reference resistance value RREF. In other words, the sensing voltage VSEN is a divided result of the external voltage VDDQ based on the second resistance value R2 and the reference resistance value RREF in the second ZQ calibrating operation.

In the step S150, the controller 150 compares a second reference voltage VREF2 and the sensing voltage VSEN to generate a second comparison result CR2 in the second ZQ calibrating operation. In the second ZQ calibrating operation, when the second comparison result CR2 indicates that the sensing voltage VSEN is higher than the second reference voltage VREF2, the controller 150 adjusts a value of the second calibration signal SC2 to a first value. Therefore, the second resistance value R2 is increased by the first value of the second calibration signal SC2.

When the second comparison result CR2 indicates that the sensing voltage VSEN is lower than the second reference voltage VREF2, the controller 150 adjusts a value of the second calibration signal SC2 to a second value. Therefore, the second resistance value R2 is decreased by the second value of the second calibration signal SC2. Besides, when the second comparison result CR2 indicates that the sensing voltage VSEN is equal to the second reference voltage VREF2, the second resistance value R2 is equal to the reference resistance value RREF. Thus, the second calibration signal SC2 is not adjusted.

In the embodiment, each of the first pull-up impedance units RU1_1 to RU1_4 and the second pull-up impedance units RU2_1 to RU2_8 is variable resistor circuit. The first resistance value R1 from each of the first pull-up impedance units RU1_1 to RU1_4 may be adjusted by a digital value of the first calibration signal SC1. The second resistance value R2 from each of the second pull-up impedance units RU2_1 to RU2_8 may be adjusted by a digital value of the second calibration signal SC2.

For example, controller 150 may adjust the digital values of the first calibration signal SC1 and the second calibration signal SC2 by 32 steps. The first resistance values R1 of the first pull-up impedance units RU1_1 to RU1_4 are positively related to the digital values of the first calibration signal SC1. For example, the first resistance values R1 of the first pull-up impedance units RU1_1 to RU1_4 are proportional to the digital values of the first calibration signal SC1. The second resistance values R2 of the second pull-up impedance units RU2_1 to RU2_8 are positively related to the digital values of the second calibration signal SC2. For example, the second resistance values R2 of the second pull-up impedance units RU2_1 to RU2_8 are proportional to the digital values of the second calibration signal SC2.

Taking the first pull-up impedance unit RU1_1 as an example, in the first ZQ calibrating operation, when the first resistance value R1 of the first pull-up impedance unit RU1_1 is calibrated, the first pull-up impedance unit RU1_1 is enabled. The first pull-up impedance units RU1_2 to RU1_4 are disabled. When the first resistance value R1 of the first pull-up impedance unit RU1_1 is calibrated, the controller 150 provides the first calibration signal SC1 having a binary-type of an initial digital value "10000" to the first pull-up impedance unit RU1_1. If the first comparation result CR1 indicates that the sensing voltage VSEN is higher than the first reference voltage VREF1, the controller 150 provides the first calibration signal SC1 having a digital value "11000" to the first pull-up impedance unit RU1_1. Then, if the first comparation result CR1 indicates that the sensing voltage VSEN is lower than the first reference voltage VREF1, the controller 150 provides the first calibration signal SC1 having a digital value "10100" to the first pull-up impedance unit RU1_1, and so on. In other words, the controller 150 adjusts the first calibration signal SC1 by a bisection method until the sensing voltage VSEN is equal to the first reference voltage VREF1 (that is, the first resistance value R1 of the first pull-up impedance unit RU1_1 is equal to the reference resistance value RREF). Besides, in order to further ensure an accuracy of the first resistance value R1 of the first pull-up impedance unit RU1_1, after adjusting the first resistance value R1 of the first pull-up impedance unit RU1_1 by bisection method, the controller 150 fine-tunes the first calibration signal SC1 by increasing the digital value by one step or decreasing the digital value by one step.

Taking the second pull-up impedance unit RU2_1 as an example, in the second ZQ calibrating operation, when the second resistance value R2 of the second pull-up impedance unit RU2_1 is calibrated, the second pull-up impedance unit RU2_1 is enabled. The second pull-up impedance units RU2_2 to RU2_8 are disabled. When the second resistance value R2 of the second pull-up impedance unit RU2_1 is calibrated, the controller 150 provides the second calibration signal SC2 having a binary-type of an initial digital value "10000" to the second pull-up impedance unit RU2_1. If the second comparation result CR2 indicates that the sensing voltage VSEN is higher than the second reference voltage VREF2, the controller 150 provides the second calibration signal SC2 having a digital value "11000" to the first pull-up impedance unit RU2_1. Then, if the second comparation result CR2 indicates that the sensing voltage VSEN is lower than the second reference voltage VREF2, the controller 150 provides the second calibration signal SC2 having a digital value "10100" to the second pull-up impedance unit RU2_1, and so on. In other words, the controller 150 also adjusts the second calibration signal SC2 by a bisection method until the sensing voltage VSEN is equal to the second reference voltage VREF2 (that is, the second resistance value R2 of the second pull-up impedance unit RU2_1 is equal to the reference resistance value RREF). Besides, in order to further ensure an accuracy of the second resistance value R2 of the second pull-up impedance unit RU2_1, after adjusting the second resistance value R2 of the second pull-up impedance unit RU2_1 by bisection method, the controller 150 fine-tunes the second calibration signal SC2 by increasing the digital value by one step or decreasing the digital value by one step.

In some embodiment, each of the values of the first calibration signal SC1 and the second calibration signal SC2 may be analog value. For example, each of the values of the first calibration signal SC1 and the second calibration signal SC2 may be a voltage value. For example, the first resistance values R1 of the first pull-up impedance units RU1_1 to RU1_4 are proportional to the voltage values of the first calibration signal SC1. For example, the second resistance values R2 of the second pull-up impedance units RU2_1 to RU2_8 are proportional to the voltage values of the second calibration signal SC2.

In the embodiment, the second ZQ calibrating operation is performed after the first ZQ calibrating operation, but the disclosure is not limited thereto. In some embodiment, the first ZQ calibrating operation is performed after the second ZQ calibrating operation.

Figure 3:
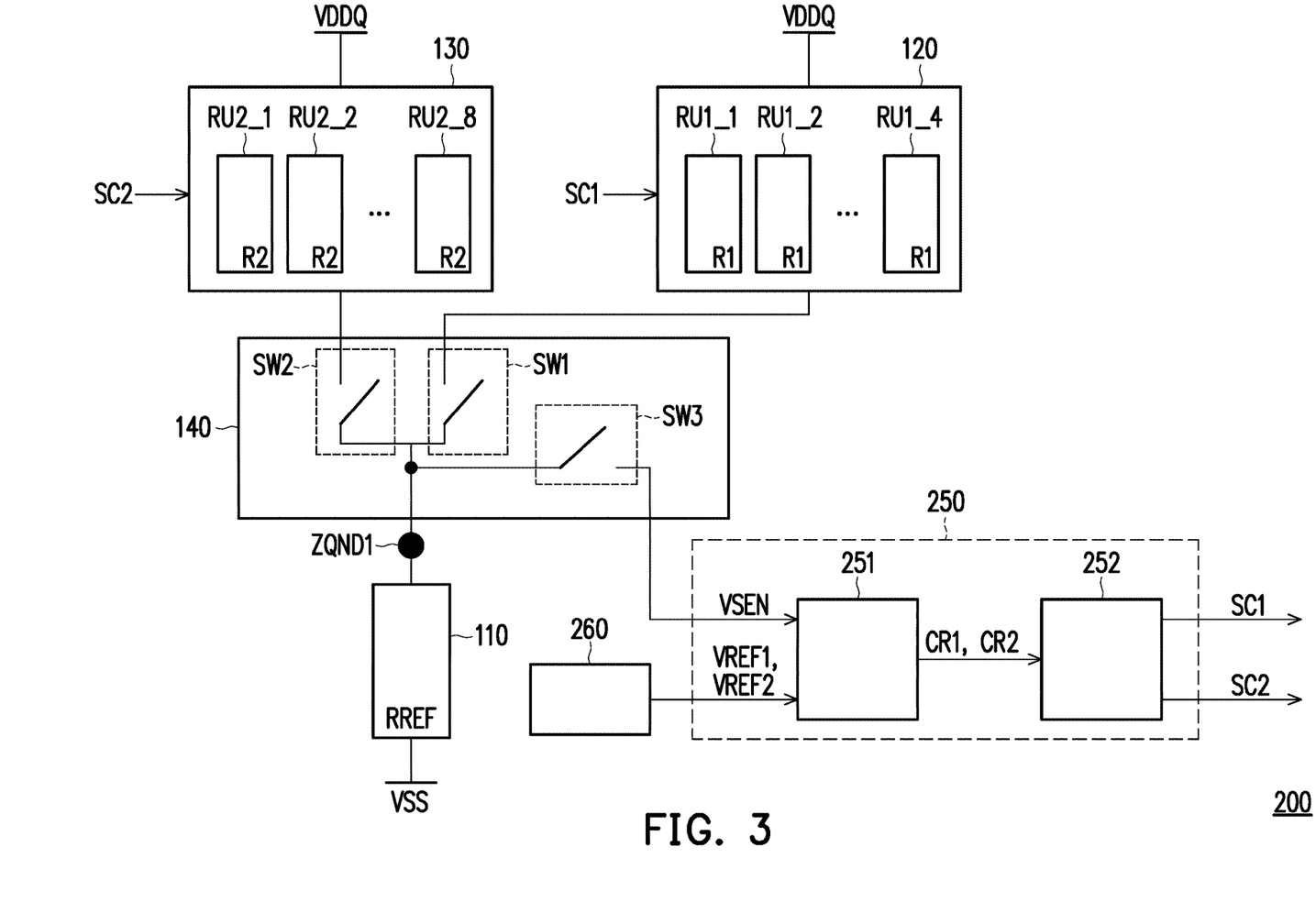
FIG. 3 illustrates a schematic diagram of an impedance adjusting circuit according to an embodiment of the disclosure.

FIG. 3 illustrates a schematic diagram of an impedance adjusting circuit according to an embodiment of the disclosure. Please refer to FIG. 3, in the embodiment, the impedance adjusting circuit 200 includes the reference resistor 110, the first pull-up impedance generator 120, the second pull-up impedance generator 130, the switching circuit 140, a controller 250 and a reference voltage generator 260. The configuration of the reference resistor 110, the first pull-up impedance generator 120, the second pull-up impedance generator 130 and the switching circuit 140 has been clearly explained in the embodiments of FIG. 1 and FIG. 2, so it will not be repeated here. In the embodiment, the reference voltage generator 260 is coupled to the controller 250. The reference voltage generator 260 provides the first reference voltage VREF1 and the second reference voltage VREF2. The controller 250 includes a comparator 251 and a signal adjusting circuit 252. The comparator 251 is coupled to the reference voltage generator 260 and the first sensing node ZQND1 through the switching circuit 140. In the first ZQ calibrating operation and the second ZQ calibrating operation, the switching circuit 140 connects the first sensing node ZQND1 to the comparator 251.

The comparator 251 compares the first reference voltage VREF1 and the sensing voltage VSEN to generate the first comparation result CR1 in the first ZQ calibrating operation. The comparator compares the second reference voltage VREF2 and the sensing voltage VSEN to generate the second comparation result CR2 in the second ZQ calibrating operation.

The signal adjusting circuit 252 is coupled to the comparator 251, the first pull-up impedance generator 120 and the second pull-up impedance generator 130. The signal adjusting circuit 252 adjusts the first calibration signal SC1 according to the first comparation result CR1 in the first ZQ calibrating operation. The signal adjusting circuit 252 adjusts the second calibration signal SC2 according to the second comparation result CR2 in the second ZQ calibrating operation.

The adjusting of the first calibration signal SC1 and the second calibration signal SC2 has been clearly explained in the embodiments of FIG. 1 and FIG. 2, so it will not be repeated here.

Figure 4:
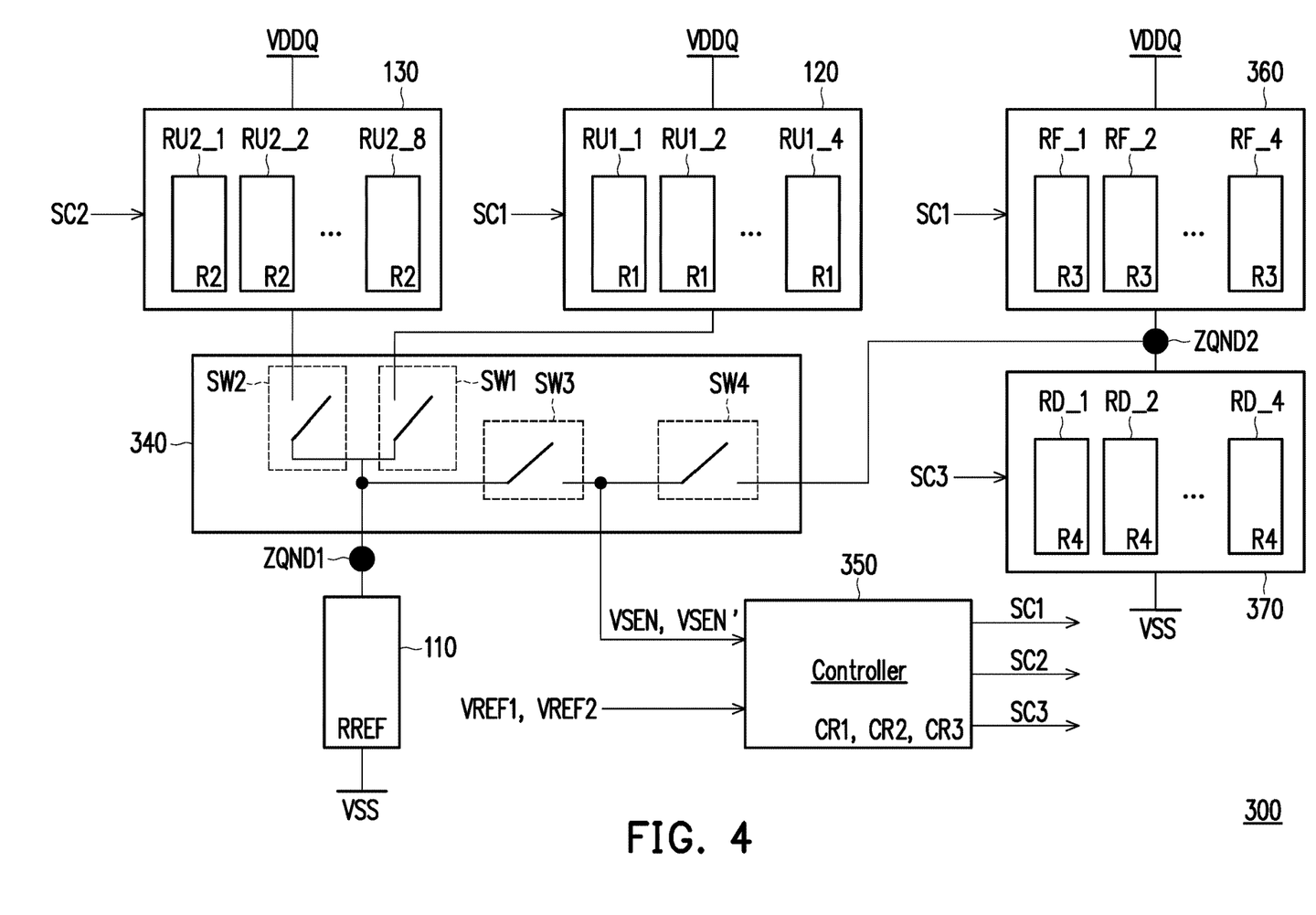
FIG. 4 illustrates a schematic diagram of an impedance adjusting circuit according to an embodiment of the disclosure.

FIG. 4 illustrates a schematic diagram of an impedance adjusting circuit according to an embodiment of the disclosure. Please refer to FIG. 4, in the embodiment, the impedance adjusting circuit 300 includes the reference resistor 110, the first pull-up impedance generator 120, the second pull-up impedance generator 130, a switching circuit 340, a controller 350, a reference pull-up impedance generator 360 and a pull-down impedance generator 370. The configuration of the reference resistor 110, the first pull-up impedance generator 120, the second pull-up impedance generator 130 has been clearly explained in the embodiments of FIG. 1 and FIG. 2, so it will not be repeated here.

In the embodiment, the reference pull-up impedance generator 360 is coupled to the switching circuit 340, the external voltage VDDQ and a second sensing node ZQND2. The reference pull-up impedance generator 360 includes third pull-up impedance units RF_1 to RF_4. The third pull-up impedance units RF_1 to RF_4 for providing a third resistance value R3 respectively in response to the first calibration signal SC1. In the embodiment, the second sensing node ZQND2 may be a connecting pad, but the disclosure is not limited thereto.

In the embodiment, the pull-down impedance generator 370 is coupled to the switching circuit 340, the low reference voltage VSS and the second sensing node ZQND2. The pull-down impedance generator 370 includes pull-down impedance units RD_1 to RD_4. The pull-down impedance units RD_1 to RD_4 provide a fourth resistance value R4 respectively in response to the third calibration signal SC3.

For example, the reference resistance value RREF is 240 Ohm. The first resistance value R1, the third resistance value R3 and the fourth resistance value R4 are about 240 Ohm. The second resistance value R2 is about 480 Ohm. The first pull-up impedance units RU1_1 to RU1_4 are calibrated one by one in the first ZQ calibrating operation. The second pull-up impedance units RU2_1 to RU2_8 are calibrated one by one in the second ZQ calibrating operation. The pull-down impedance units RD_1 to RD_4 are calibrated one by one in a third ZQ calibrating operation. Thus, the first reference voltage VREF1 is set to half of the external voltage VDDQ (that is, VREF1=0.5×VDDQ). The second reference voltage VREF2 is set to one-third of VDDQ (that is, VREF2=0.33×VDDQ). For example, all of the first pull-up impedance units RU1_1 to RU1_4 are connected in parallel in the first ZQ calibrating operation. All of the second pull-up impedance units RU2_1 to RU2_8 are connected in parallel in the second ZQ calibrating operation. All of the pull-down impedance units RD_1 to RD_4 are connected in parallel in the third ZQ calibrating operation. Thus, the first reference voltage VREF1 is set to 0.8×VDDQ in the first ZQ calibrating operation. The second reference voltage VREF2 is also set to 0.8×VDDQ in the second ZQ calibrating operation.

In the embodiment, a design of the reference pull-up impedance generator 360 and a design of the first pull-up impedance generator 120 are similar from each other. It should be noted, the third resistance value R3 is provided respectively in response to the first calibration signal SC1. Therefore, after the first ZQ calibrating operation, the third resistance value R3 is similar to the first resistance value R1 after calibrated. In other words, the reference pull-up impedance generator 360 is acts as a replica circuit of the first pull-up impedance generator 120 after the first ZQ calibrating operation. For example, a tolerance between the first resistance value R1 and the third resistance value R3 could be controlled below 10%. Therefore, the third resistance value R3 is acted to be a reference resistance value for a third ZQ calibrating operation in response to the first calibration signal SC1. The controller 350 compares the first reference voltage VREF1 and a sensing voltage VSEN' on the second sensing node ZQND2 to generate the third calibration signal SC3 in the third ZQ calibrating operation.

In the embodiment, the switching circuit 340 connects the second sensing node ZQND2 to the controller 350 in the third ZQ calibrating operation. The switching circuit 340 disconnects a connection between the first sensing node ZQND1 and the controller in the third ZQ calibrating operation.

The switching circuit 340 connects the first sensing node ZQND1 to the controller 350 in the first ZQ calibrating operation and the second ZQ calibrating operation. The switching circuit 340 disconnects a connection between the second sensing node ZQND2 and the controller 350 in the first ZQ calibrating operation and the second ZQ calibrating operation.

The switching circuit 340 includes switches SW1 to SW4. A first terminal of the switch SW1 is connected to the first pull-up impedance generator 120. A second terminal of the switch SW1 is connected to the first sensing node ZQND1. A first terminal of the switch SW2 is connected to the second pull-up impedance generator 130. A second terminal of the switch SW2 is connected to the first sensing node ZQND1. A first terminal of the switch SW3 is connected to the first sensing node ZQND1. A second terminal of the switch SW3 is connected to the controller 350. A first terminal of the switch SW4 is connected to the second sensing node ZQND2. A second terminal of the switch SW4 is connected to the controller 350.

In the embodiment, in the first ZQ calibrating operation, the switches SW1 and SW3 are turned on. The switches SW2 and SW4 are turned off. Therefore, the first pull-up impedance generator 120 and the controller 350 are connected to the first sensing node ZQND1. In the second ZQ calibrating operation, the switches SW2 and SW3 are turned on. The switches SW1 and SW4 are turned off. Therefore, the second pull-up impedance generator 130 and the controller 350 are connected to the first sensing node ZQND1. In the third ZQ calibrating operation, the switch SW4 is turned on. The switches SW3 is turned off. Therefore, the reference pull-up impedance generator 360, the pull-down impedance generator 370 and the controller 350 are connected to the second sensing node ZQND2.

In the embodiment, each of the switches SW1 to SW4 is implemented by at least one transistor or transmission gate. The operations of the switches SW1 to SW4 may be controlled by the controller 350.

In the embodiment, the reference pull-up impedance generator 360 includes four third pull-up impedance units RF_1 to RF_4. The pull-down impedance generator 370 includes four pull-down impedance units RD_1 to RD_4. In some embodiments, the reference pull-up impedance generator 360 includes at least one third pull-up impedance unit. The pull-down impedance generator 370 includes at least one pull-down impedance unit, the disclosure is not limited by the amount of the third pull-up impedance unit and the amount of the pull-down impedance unit.

Figure 5:
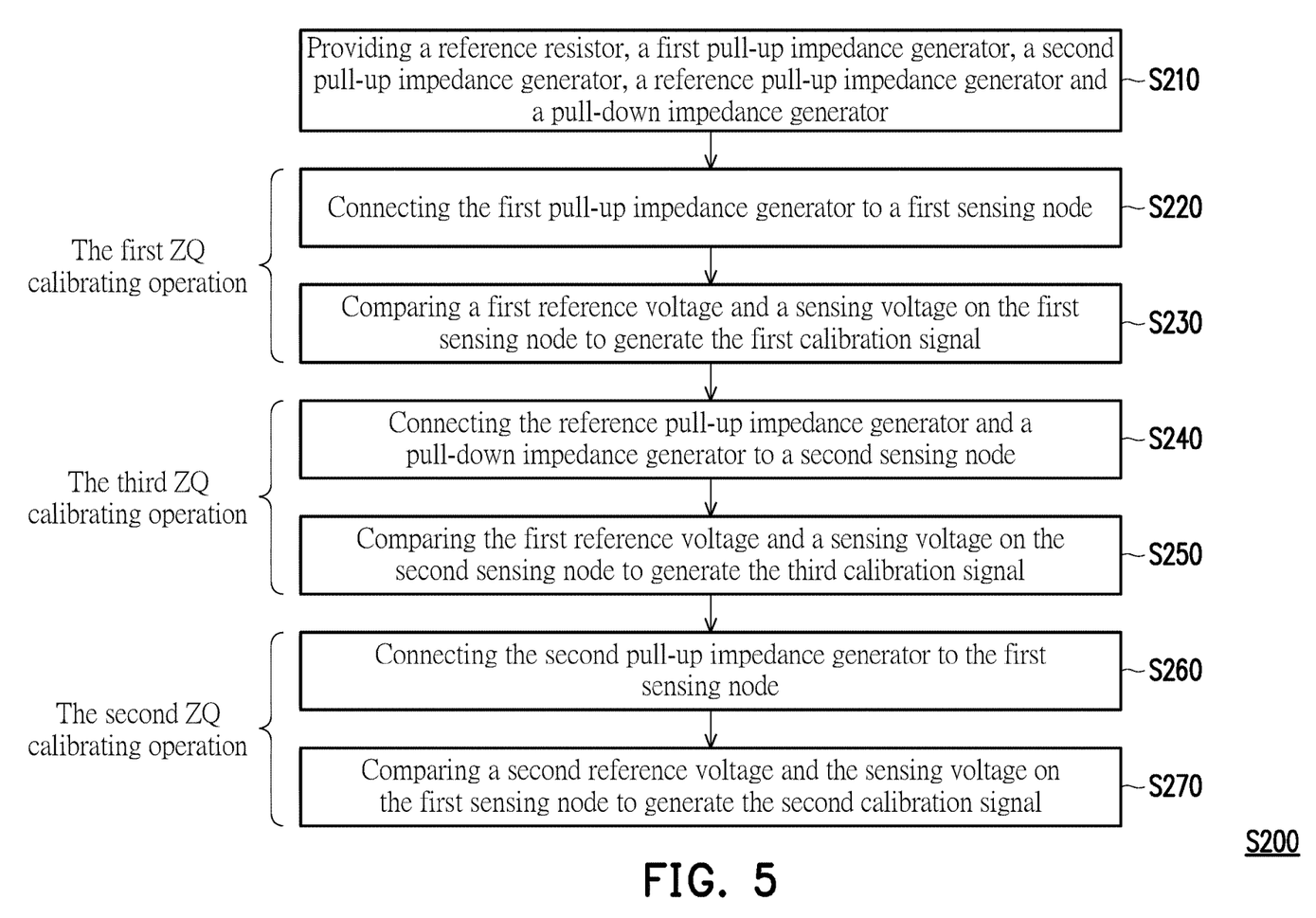
FIG. 5 illustrates a flow chart of an impedance adjusting method according to an embodiment of the disclosure.

FIG. 5 illustrates a flow chart of an impedance adjusting method according to an embodiment of the disclosure. Please refer to FIG. 4 and FIG. 5, in the embodiment, the impedance adjusting method S200 includes steps S210 to S270. In the step S210, the reference resistor 110, the first pull-up impedance generator 120, the second pull-up impedance generator 130, the reference pull-up impedance generator 360 and the pull-down impedance generator 370 are provided. The configuration of the reference resistor 110, the first pull-up impedance generator 120 and the second pull-up impedance generator 130, the reference pull-up impedance generator 360 and the pull-down impedance generator 370 has been clearly explained in the embodiments of FIG. 1 and FIG. 4, so it will not be repeated here.

In the step S220, the switching circuit 340 connects the first pull-up impedance generator 120 to the first sensing node ZQND1 in the first ZQ calibrating operation. Therefore, the sensing voltage VSEN is generated according to the external voltage VDDQ, the first resistance value R1 and the reference resistance value RREF. In other words, the sensing voltage VSEN is a divided result of the external voltage VDDQ based on the first resistance value R1 and the reference resistance value RREF in the first ZQ calibrating operation.

In the step S230, in the first ZQ calibrating operation, the controller 150 compares the first reference voltage VREF1 and the sensing voltage VSEN to generate the first calibration signal SC1. Therefore, the first pull-up impedance generator 120 adjusts the first resistance value R1 in response to the first calibration signal SC1. The operation of the step S230 has been clearly explained in the embodiments of FIG. 1 and FIG. 2, so it will not be repeated here.

In the step S240, the switching circuit 340 connects the reference pull-up impedance generator 360 and the pull-down impedance generator 370 to the second sensing node ZQND2 in the third ZQ calibrating operation. Therefore, the sensing voltage VSEN' on the second sensing node ZQND2 is generated according to the external voltage VDDQ, the third resistance value R3 and the fourth resistance value R4. In other words, the sensing voltage VSEN' is a divided result of the external voltage VDDQ based on the third resistance value R3 and the fourth resistance value R4 in the third ZQ calibrating operation. It should be noted, the third resistance value R3 is provided respectively in response to the first calibration signal SC1. Therefore, after the first ZQ calibrating operation, the third resistance value R3 is similar to the first resistance value R1 after calibrated. Therefore, the third resistance value R3 is acted to be a reference resistance value for the third ZQ calibrating operation.

In the step S250, in the third ZQ calibrating operation, the controller 350 compares the first reference voltage VREF1 and the sensing voltage VSEN' to generate the third calibration signal SC3. Therefore, the pull-down impedance generator 370 adjusts the fourth resistance value R4 in response to the third calibration signal SC3.

In the embodiment, each of the pull-down impedance units RD_1 to RD_4 is variable resistor circuit. The fourth resistance value R4 from each of the pull-down impedance units RD_1 to RD_4 may be adjusted by a digital value of the third calibration signal SC3.

For example, controller 350 may adjust the digital values of the third calibration signal SC3 by 32 steps. The fourth resistance value R4 of the pull-down impedance units RD_1 to RD_4 are positively related to the digital values of the third calibration signal SC3. For example, the fourth resistance value R4 of the pull-down impedance units RD_1 to RD_4 are proportional to the digital values of the third calibration signal SC3.

Taking the pull-down impedance unit RD_1 as an example, in the third ZQ calibrating operation, when the fourth resistance value R4 of the pull-down impedance unit RD_1 is calibrated, the pull-down impedance unit RD_1 is enabled. The pull-down impedance units RD_2 to RD_4 are disabled. When the fourth resistance value R4 of the pull-down impedance unit RD_1 is calibrated, the controller 350 provides the third calibration signal SC3 having a binary-type of an initial digital value "10000" to the pull-down impedance unit RD_1. If the third comparison result CR3 indicates that the sensing voltage VSEN' is higher than the first reference voltage VREF1, the controller 350 provides the third calibration signal SC3 having a digital value "01000" to the pull-down impedance unit RD_1. Then, if the third comparison result CR3 indicates that the sensing voltage VSEN' is lower than the first reference voltage VREF1, the controller 350 provides the third calibration signal SC3 having a digital value "01100" to the pull-down impedance unit RD_1, and so on. In other words, the controller 350 adjusts the third calibration signal SC3 by the bisection method until the sensing voltage VSEN' is equal to the first reference voltage VREF1 (that is, the fourth resistance value R4 of the pull-down impedance unit RD_1 is equal to the reference resistance value RREF and the third resistance value R3). Besides, in order to further ensure an accuracy of the fourth resistance value R4 of the pull-down impedance unit RD_1, after adjusting the fourth resistance value R4 of the pull-down impedance unit RD_1 by bisection method, the controller 350 fine-tunes the third calibration signal SC3 by increasing the digital value by one step or decreasing the digital value by one step.

In some embodiment, the value of the third calibration signal SC3 may be analog value. For example, the value of the third calibration signal SC3 may be a voltage value. For example, the fourth resistance values R4 of the pull-down impedance units RD_2 to RD_4 are proportional to the voltage values of the third calibration signal SC3.

In the step S260, the switching circuit 340 connects the second pull-up impedance generator 130 to the first sensing node ZQND1 in the second ZQ calibrating operation. Therefore, in the second ZQ calibrating operation, the sensing voltage VSEN is generated according to the external voltage VDDQ, the second resistance value R2 and the reference resistance value RREF. In other words, the sensing voltage VSEN is a divided result of the external voltage VDDQ based on the second resistance value R2 and the reference resistance value RREF in the second ZQ calibrating operation.

In the step S270, the controller 150 compares the second reference voltage VREF2 and the sensing voltage VSEN to generate a second comparison result CR2 in the second ZQ calibrating operation. Therefore, the second pull-up impedance generator 130 adjusts the second resistance value R2 in response to the second calibration signal SC2. The operation of the step S270 has been clearly explained in the embodiments of FIG. 1 and FIG. 2, so it will not be repeated here.

In the embodiment, the second ZQ calibrating operation is performed after the third ZQ calibrating operation, but the disclosure is not limited thereto. In some embodiment, the third ZQ calibrating operation is performed after the second ZQ calibrating operation.

In view of the foregoing, the second pull-up impedance generator providing the second resistance value is provided. The second resistance value is different from the first resistance value. Therefore, the impedance adjusting circuit increases a parameter adjusting margin of a memory device. Besides, the second pull-up impedance generator is calibrated in the second ZQ calibrating operation. Therefore, a tolerance of the second resistance value is decreased.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A impedance adjusting circuit for zero quotient (ZQ) calibration, comprising:
   a reference resistor, coupled between a first sensing node and a low reference voltage;
   a first pull-up impedance generator, coupled to an external voltage, wherein the first pull-up impedance generator comprises a plurality of first pull-up impedance units for providing a first resistance value respectively in response to a first calibration signal;
   a second pull-up impedance generator, coupled to the external voltage, wherein the second pull-up impedance generator comprises a plurality of second pull-up impedance units for providing a second resistance value respectively in response to a second calibration signal, wherein the second resistance value is different from the first resistance value;
   a switching circuit, configurated to connect the first pull-up impedance generator to the first sensing node in a first ZQ calibrating operation and connect the second pull-up impedance generator to the first sensing node in a second ZQ calibrating operation;
   a reference pull-up impedance generator, coupled to the external voltage and a second sensing node, wherein the reference pull-up impedance generator comprises a plurality of third pull-up impedance units for providing a third resistance value respectively in response to the first calibration signal; and
   a controller, coupled to the first sensing node through the switching circuit, configured to compare a first reference voltage and a sensing voltage on the first sensing node to generate the first calibration signal in the first ZQ calibrating operation, and compare a second reference voltage and the sensing voltage on the first sensing node to generate the second calibration signal in the second ZQ calibrating operation,
   wherein the switching circuit comprises:
      a first switch, coupled between the first sensing node and the controller; and
      a second switch, coupled between the second sensing node and the controller
   wherein in the first ZQ calibrating operation and the second ZQ calibrating operation, the first switch is turned on and the second switch is turned off, and
   wherein in a third ZQ calibrating operation, the first switch is turned off and the second switch is turned on.

2. The impedance adjusting circuit of claim 1, wherein the second resistance value is higher than the first resistance value.

3. The impedance adjusting circuit of claim 1, wherein the switching circuit connects the first sensing node to the controller in the first ZQ calibrating operation and in the second ZQ calibrating operation.

4. The impedance adjusting circuit of claim 1, comprising:
   a reference voltage generator, coupled to the controller, configured to provide the first reference voltage and the second reference voltage.

5. The impedance adjusting circuit of claim 1, wherein the controller comprises:
   a comparator, coupled to the first sensing node through the switching circuit, configured to compare the first reference voltage and the sensing voltage on the first sensing node to generate a first comparation result in the first ZQ calibrating operation, and compare the second reference voltage and the sensing voltage on the first sensing node to generate a second comparation result in the second ZQ calibrating operation; and
   a signal adjusting circuit, coupled to the comparator, the first pull-up impedance generator and the second pull-up impedance generator, configured to adjust the first calibration signal according to the first comparation result in the first ZQ calibrating operation, and adjust the second calibration signal according to the second comparation result in the second ZQ calibrating operation.

6. The impedance adjusting circuit of claim 1, wherein in the first ZQ calibrating operation, the sensing voltage is generated according to the external voltage, the first resistance value and a reference resistance value of the reference resistor.

7. The impedance adjusting circuit of claim 6, wherein in the first ZQ calibrating operation:
   when the first comparation result indicates that the sensing voltage is higher than the first reference voltage, the controller increases the first resistance value by a first value of the first calibration signal, and
   when the first comparation result indicates that the sensing voltage is lower than the first reference voltage, the controller decreases the first resistance value by a second value of the first calibration signal.

8. The impedance adjusting circuit of claim 1, wherein in the second ZQ calibrating operation, the sensing voltage is generated according to the external voltage, the second resistance value and a reference resistance value of the reference resistor.

9. The impedance adjusting circuit of claim 8, wherein in the second ZQ calibrating operation:
   when the second comparation result indicates that the sensing voltage is higher than the second reference voltage, the controller increases the second resistance value by a first value of the second calibration signal, and
   when the second comparation result indicates that the sensing voltage is lower than the second reference voltage, the controller decreases the second resistance value by a second value of the second calibration signal.

10. The impedance adjusting circuit of claim 1, further comprising:
    a pull-down impedance generator, coupled to the switching circuit, the low reference voltage and the second sensing node, wherein the pull-down impedance generator comprises a plurality of pull-down impedance units for providing a fourth resistance value respectively in response to a third calibration signal.

11. The impedance adjusting circuit of claim 10, wherein the switching circuit connects the second sensing node to the controller in the third ZQ calibrating operation, and disconnects a connection between the first sensing node and the controller in the third ZQ calibrating operation.

12. The impedance adjusting circuit of claim 10, wherein the controller acts the third resistance value as a reference resistance value in response to the first calibration signal in the third ZQ calibrating operation.

13. The impedance adjusting circuit of claim 12, wherein the controller compares the first reference voltage and a sensing voltage on the second sensing node to generate the third calibration signal in the third ZQ calibrating operation.

14. A impedance adjusting method for zero quotient (ZQ) calibration, comprising:
    providing a reference resistor, a first pull-up impedance generator, a second pull-up impedance generator, a reference pull-up impedance generator and a switching circuit, wherein the reference resistor is coupled between a first sensing node and a low reference voltage, wherein the first pull-up impedance generator comprises a plurality of first pull-up impedance units for providing a first resistance value respectively in response to a first calibration signal, wherein the second pull-up impedance generator comprises a plurality of second pull-up impedance units for providing a second resistance value respectively in response to a second calibration signal, wherein the second resistance value is different from the first resistance value, wherein the reference pull-up impedance generator is coupled to the external voltage and a second sensing node, wherein the reference pull-up impedance generator comprises a plurality of third pull-up impedance units for providing a third resistance value respectively in response to the first calibration signal;

connecting the first pull-up impedance generator to the first sensing node in a first ZQ calibrating operation;

comparing a first reference voltage and a sensing voltage on the first sensing node to generate the first calibration signal in the first ZQ calibrating operation;

connecting the second pull-up impedance generator to the first sensing node in a second ZQ calibrating operation; and comparing a second reference voltage and the sensing voltage on the first sensing node to generate the second calibration signal in the second ZQ calibrating operation, wherein the switching circuit comprises:
 a first switch, coupled between the first sensing node and the controller; and
 a second switch, coupled between the second sensing node and the controller wherein in the first ZQ calibrating operation and the second ZQ calibrating operation, the first switch is turned on and the second switch is turned off, and wherein in a third ZQ calibrating operation, the first switch is turned off and the second switch is turned on.

15. The impedance adjusting method of claim 14, wherein the second resistance value is higher than the first resistance value.

16. The impedance adjusting method of claim 14, wherein the step of comparing the first reference voltage and the sensing voltage on the first sensing node to generate the first calibration signal in the first ZQ calibrating operation comprises:

comparing the first reference voltage and the sensing voltage on the first sensing node to generate a first comparation result;

when the first comparation result indicates that the sensing voltage is higher than the first reference voltage, increasing the first resistance value by a first value of the first calibration signal; and when the first comparation result indicates that the sensing voltage is lower than the first reference voltage, decreasing the first resistance value by a second value of the first calibration signal.

17. The impedance adjusting method of claim 14, wherein the step of comparing the second reference voltage and the sensing voltage on the first sensing node to generate the second calibration signal in the second ZQ calibrating operation comprises:

comparing the second reference voltage and the sensing voltage on the first sensing node to generate a second comparation result;

when the second comparation result indicates that the sensing voltage is higher than the second reference voltage, increasing the second resistance value by a first value of the second calibration signal; and when the second comparation result indicates that the sensing voltage is lower than the second reference voltage, decreasing the second resistance value by a second value of the second calibration signal.

18. The impedance adjusting method of claim 14, further comprising:

providing a pull-down impedance generator, wherein the pull-down impedance generator is coupled to the low reference voltage and the second sensing node, wherein the pull-down impedance generator comprises a plurality of pull-down impedance units for providing a fourth resistance value respectively in response to a third calibration signal.

19. The impedance adjusting method of claim 18, further comprising:

acting the third resistance value as a reference value in response to the first calibration signal in the third ZQ calibrating operation.

20. The impedance adjusting method of claim 18, further comprising:

comparing the first reference voltage and a sensing voltage on the second sensing node to generate the third calibration signal in the third ZQ calibrating operation.

* * * * *